(12) United States Patent  (10) Patent No.: US 9,136,321 B1
Narasimha et al.  (45) Date of Patent: Sep. 15, 2015

(54) LOW ENERGY ION IMPLANTATION OF A JUNCTION BUTTING REGION

(71) Applicant: International Business Machines Corporation, Armonk, NY (US)

(72) Inventors: Shreesh Narasimha, Beacon, NY (US); Katsunori Onishi, Somers, NY (US); Paul C. Parries, Beacon, NY (US); Chengwen Pei, Danbury, CT (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/265,410

(22) Filed: Apr. 30, 2014

(51) Int. Cl.
  H01L 29/06 (2006.01)
  H01L 21/336 (2006.01)
  H01L 29/78 (2006.01)
  H01L 21/36 (2006.01)
  H01L 29/66 (2006.01)

(52) U.S. Cl.
  CPC ............ *H01L 29/0603* (2013.01); *H01L 21/36* (2013.01); *H01L 29/66636* (2013.01); *H01L 29/78* (2013.01)

(58) Field of Classification Search
  None
  See application file for complete search history.

(56) References Cited

U.S. PATENT DOCUMENTS

| | | |
|---|---|---|
| 6,238,967 B1 | 5/2001 | Shiho et al. |
| 6,406,971 B1 | 6/2002 | Chien et al. |
| 6,410,399 B1 | 6/2002 | Flaitz et al. |
| 6,538,287 B2 | 3/2003 | Wang et al. |
| 6,873,010 B2 | 3/2005 | Chidambarrao et al. |
| 7,960,229 B2 * | 6/2011 | Yang et al. ............ 438/259 |
| 8,202,767 B2 | 6/2012 | Cheng et al. |
| 8,236,632 B2 | 8/2012 | Fried et al. |
| 8,236,661 B2 | 8/2012 | Dennard et al. |
| 8,298,907 B2 | 10/2012 | Ho et al. |
| 8,404,540 B2 | 3/2013 | Cheng et al. |
| 2007/0196990 A1 * | 8/2007 | Hsiao et al. .......... 438/301 |
| 2012/0112280 A1 * | 5/2012 | Johnson et al. ........ 257/347 |
| 2012/0187490 A1 | 7/2012 | Fried et al. |
| 2013/0270642 A1 | 10/2013 | Hook |
| 2014/0256109 A1 * | 9/2014 | Yin et al. ............ 438/300 |

* cited by examiner

*Primary Examiner* — Marc Armand
*Assistant Examiner* — Younes Boulghassoul
(74) *Attorney, Agent, or Firm* — Gibb & Riley, LLC; Yuanmin Cai, Esq.

(57) ABSTRACT

The present invention relates generally to semiconductor devices and more particularly, to a structure and method of forming a junction butting region using low energy ion implantation to reduce parasitic leakage and body-to-body leakage between adjacent FETs that share a common contact in high density memory technologies, such as dynamic random access memory (DRAM) devices and embedded DRAM (eDRAM) devices. A method disclosed may include forming a junction butting region at the bottom of a trench formed in a semiconductor on insulator (SOI) layer using low energy ion implantation and protecting adjacent structures from damage from ion scattering using a protective layer.

12 Claims, 9 Drawing Sheets

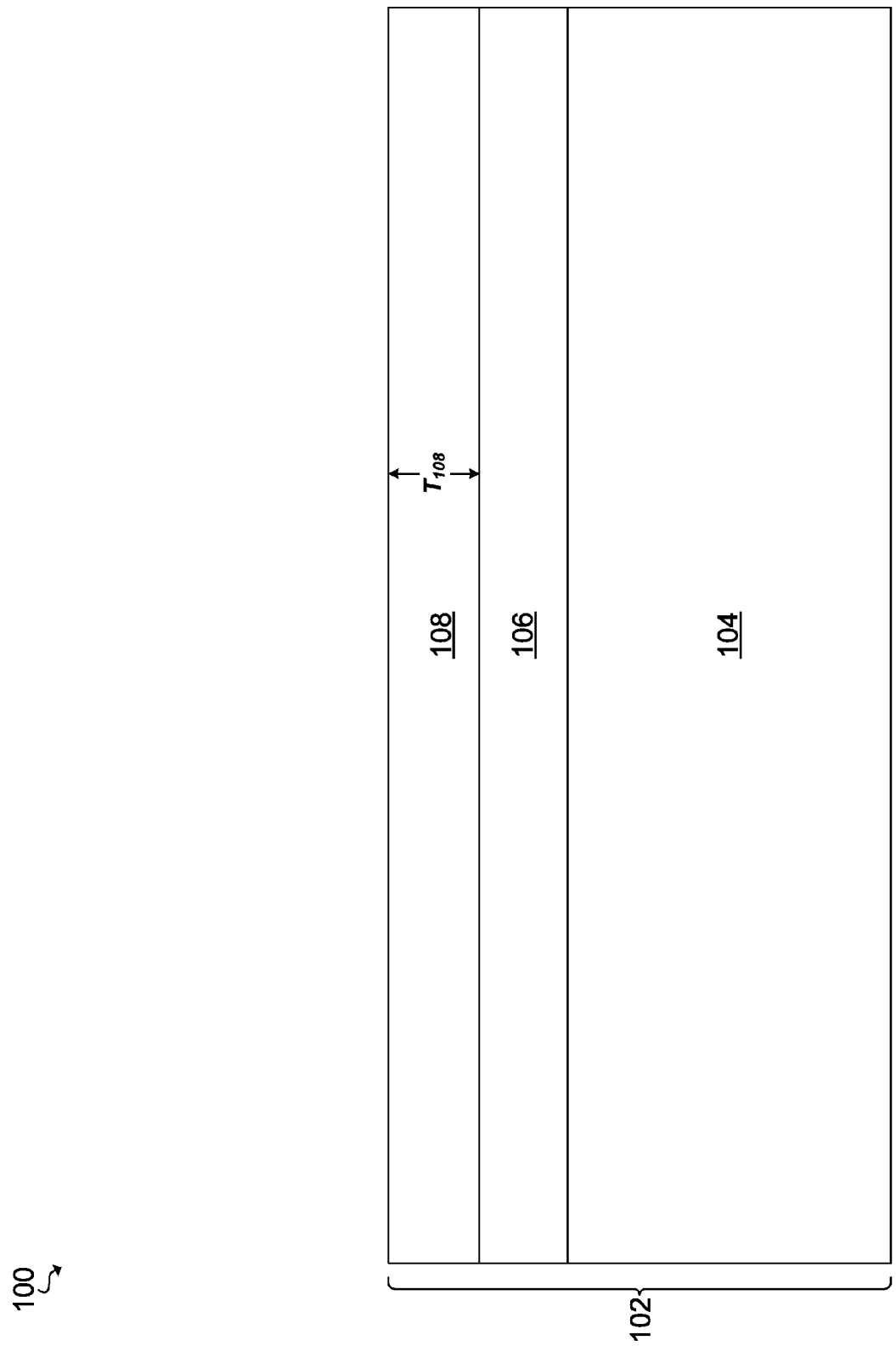

LOW ENERGY ION IMPLANTATION OF A JUNCTION BUTTING REGION

BACKGROUND

The present invention relates generally to semiconductor devices and more particularly, to a structure and method of forming a junction butting region using low energy ion implantation to reduce parasitic leakage and body-to-body leakage between adjacent FETs that share a common contact in high density memory technologies, such as dynamic random access memory (DRAM) devices and embedded DRAM (eDRAM) devices.

Integrated circuits fabricated in semiconductor on insulator (SOI) technology rely on adjacent field effect transistors (FETs) being electrically isolated from each other. However, when coupled with the need for decreasing the size of the FETs, such as, for example, in very-large-scale integration (VLSI) technologies like high density memory technologies, the very nature of the isolation can create undesired effects in the FETs such as FET to FET leakage and short channel effects.

SUMMARY

According to an embodiment, a method is disclosed. The method may include: forming a junction butting region in an embedded dynamic random access memory (eDRAM) device using low energy ion implantation. The junction butting region may be located directly below a trench formed in a semiconductor on insulator (SOI) layer between a first gate stack and a second gate stack. The first gate stack and the second gate stack may be protected from damage during the low energy ion implantation by a protective layer.

According to another embodiment, a method is disclosed. The method may include: forming a protective layer over a first gate stack, over a second gate stack, and over a portion of a semiconductor on insulator (SOI) layer between the first gate stack and the second gate stack; removing a portion of the protective layer over the portion of the SOI layer, such that the portion of the SOI layer is exposed and the first gate stack and the second gate stack remain covered by the protective layer; forming a trench in the portion of the SOI layer, the trench having a bottom and a pair of sidewalls, and the trench having a depth less than a thickness of the SOI layer; and doping the SOI layer at the bottom of the trench using a low energy ion implantation technique to form a junction butting region, such that the junction butting region extends from the bottom of the trench down to the isolation layer immediately below the SOI layer.

According to another embodiment, an eDRAM structure is disclosed. The eDRAM structure may include: a first gate stack and a second gate stack on a semiconductor on insulator (SOI) layer; a source-drain (S-D) region between the first gate stack and the second gate stack, the S D region extending from an upper surface of the SOI layer to an interior region of the SOI layer, and the S-D region having a bottom and a pair of sidewalls; a silicide layer on the S-D region; a protective layer only on the SOI layer, the first gate stack, the second gate stack; and a junction butting region directly below the S-D region, the junction butting region extending from the bottom of the S-D region to an isolation layer immediately below the SOI layer.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

FIG. 1A is a cross section view illustrating a structure, according to an embodiment of the present invention.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1B:
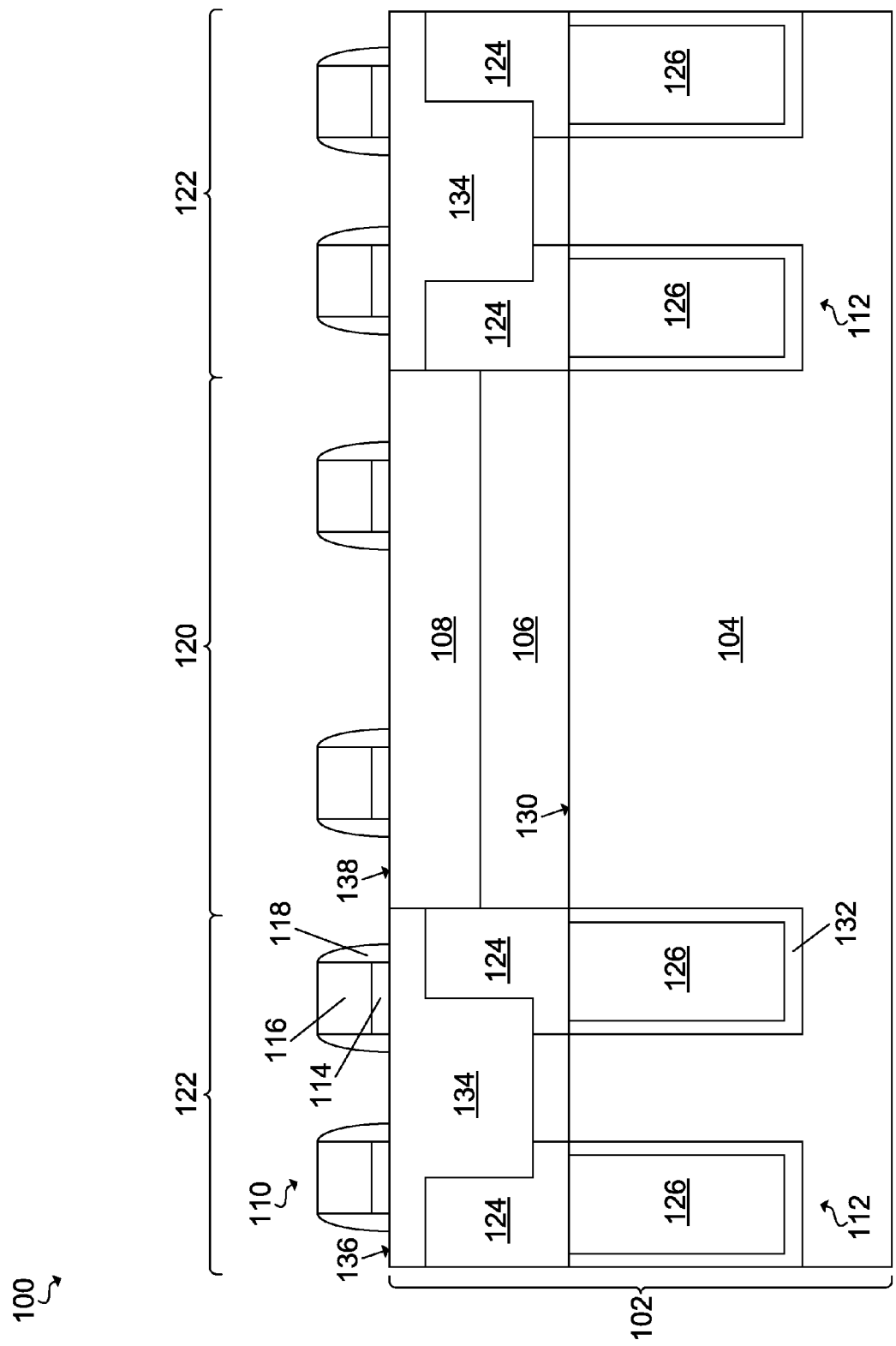
FIG. 1B is a cross section view illustrating forming gate structures, deep trench (DT) capacitors, and shallow trench isolation (STI) regions on the structure, according an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to semiconductor devices and more particularly, to a structure and method of forming a junction butting region using low energy ion implantation to reduce parasitic leakage and body-to-body leakage between adjacent FETs that share a common contact in high density memory technologies, such as dynamic random access memory (DRAM) devices and embedded DRAM (eDRAM) devices. The present invention may be particularly useful in reducing parasitic leakage in memory devices fabricated on a semiconductor on insulator (SOI) substrate having a very small pitch between individual memory cells that share a common bit line, such as in advanced eDRAM technology.

A SOI substrate may include an amorphous buried oxide layer (BOX layer), for example, a silicon oxide (SiO2) layer, between an upper single-crystal silicon layer and a supporting silicon substrate which may also be single-crystal silicon. When, for example, a n-channel FET (NFET) is fabricated adjacent to a p-channel FET (PFET), in SOI technology, the adjacent devices (for example, NFET, PFET) may be electrically isolated from each other by trench isolation (trenches filled with a dielectric material such as silicon oxide that extend from the top surface of the upper silicon layer in which the devices are fabricated down to the BOX layer of the SOI substrate. The trench isolation prevents body-to-body leakage between the adjacent devices.

When a PFET is fabricated adjacent to another PFET (or an NFET is fabricated adjacent to another NFET) the adjacent devices may be electrically isolated from each other by their source-drain regions (S-D regions) which may extend from the top surface of the upper silicon layer in which the devices are fabricated down to the BOX layer. The S-D regions themselves may abut the BOX layer (i.e., a hard butted SOI junction isolation), or a depletion region of the S-D region may abut the BOX layer (i.e., a soft butted SOI junction isolation) to prevent body-to-body leakage between the adjacent devices. The soft butted SOI junction isolation is usually is achieved by deep S-D implantation using high energy ion implantation, for example 20 keV to 50 keV, or more depending on different species. Using these techniques, adjacent devices may share a common S-D region that is relied upon for device isolation. This may allow for a significant decrease in the silicon area required for each device, thereby increasing device density and device performance, i.e., speed.

However, when butted SOI junction isolation is used in devices where the FET channel length is of the same order of magnitude as the depletion-layer widths of the source and drain junctions, short-channel effects become a significant problem. The channel length is the distance between two S-D regions on either side of the gate of an FET measured parallel to the top surface of the upper silicon layer. The depletion widths are measured under the gate in the same direction as the channel length. Short-channel effects include drain-induced barrier lowering and punch through, surface scattering, velocity saturation, impact ionization and hot electron effects which may be attributed to the short electron drift region of the channel and the lowering of the threshold voltage ($V_t$) due to the shortened channel length.

The short channel effect in butted SOI junction isolation devices may be further exaggerated by lateral (i.e., across surrounding devices) scattering of the deep ion implantations normally used to form a junction butting region of the S-D region in the vicinity of the buried oxide layer. The deeper an ion implantation is, the higher the probability of lateral scattering may be. One way to reduce ion scattering and to ensure proper junction butting may be to form a trench in the SOI layer between two gate structures, form a protective nitride layer over all areas except the trench, and perform a low energy ion implantation process to form a junction butting region underneath the trench. Embodiments by which to form the junction butting region using low energy ion implantation are described below in detail with reference to FIGS. 1A-8.

Referring now to FIG. 1A, a cross section view of a structure 100 is shown. The structure 100 may be a semiconductor on insulator (SOI) substrate 102. The SOI substrate 102 may include an SOI layer 108 separated from a semiconductor layer 104 by an isolation layer 106. The isolation layer 106 may composed of silicon dioxide. In an embodiment, the SOI layer 108 may be composed of single-crystal silicon.

In an embodiment in which the structure 100 will be used to form a p-channel FET (PFET) device, the SOI layer 108 may be an undoped or lightly doped with n-type dopants, such as for example, phosphorus and arsenic, at a concentration ranging from approximately 1E16 atm/cm³ to approximately 1E19 atm/cm³. In an embodiment in which the structure 100 will be used to form a n-channel FET (NFET) device, the SOI layer 108 may be an undoped or lightly doped with p-type dopants, such as for example, boron, at a concentration ranging from approximately 1E16 atm/cm³ to approximately 1E19 atm/cm³. In an embodiment, the SOI layer 108 is intrinsic (i.e., completely undoped). The SOI layer 108 may have a thickness T108 ranging from approximately 20 nm to approximately 300 nm, preferably from approximately 50 nm to approximately 100 nm.

The semiconductor layer 104 may be composed of doped semiconductor material, such as, a doped crystalline semiconductor material, a doped polycrystalline semiconductor material, or an amorphous semiconductor material that is subsequently annealed to form a doped polycrystalline semiconductor material. The doped semiconductor material may be formed with in-situ doping or implantation. The doped semiconductor material may be selected from doped crystalline silicon, polysilicon, doped polycrystalline germanium, a doped silicon-germanium polycrystalline alloy, a doped silicon carbon polycrystalline alloy, a doped silicon-germanium-carbon polycrystalline alloy, doped polycrystalline gallium arsenide, doped polycrystalline indium arsenide, doped polycrystalline indium phosphide, doped polycrystalline III-V compound semiconductor materials, doped polycrystalline II-VI compound semiconductor materials, doped polycrystalline organic semiconductor materials, and other doped polycrystalline compound semiconductor materials.

The thickness of the semiconductor layer 104 may range from approximately 1 micron to approximately 10 microns, although lesser and greater thicknesses may also be employed. The semiconductor layer 104 may be doped with n-type dopants or p-type dopants. The dopant concentration of the semiconductor layer 104 may range from approximately 5.0E18 atm/cm³ to approximately 3.0E21 atm/cm³, although lesser and greater dopant concentrations can also be employed.

Referring now to FIG. 1B, a cross section view illustrating forming an embedded dynamic random access memory (eDRAM) device in the structure 100 is shown. FIG. 1B illustrates forming a plurality of gate stacks 110 (hereinafter "gate stacks"), a plurality of deep trench capacitors 112 (hereinafter "DT capacitors"), and a plurality of shallow trench isolation (STI) regions 134 (hereinafter "STI regions") in the SOI substrate 102.

Each of the gate stacks 110 may include a gate dielectric layer 114 on the SOI layer 108 and a gate electrode 116 formed on the gate dielectric layer 114. Optional dielectric sidewall spacers 118 may be formed on opposite sidewalls of the dielectric layer 114 and gate electrode 116. In an embodiment, the gate electrode 116 may comprise a doped or undoped polysilicon, a metal, or combinations of layers thereof. In an embodiment, the gate dielectric layer 114 may comprise SiO2, silicon nitride ($Si_3N_4$) or combinations thereof. In one example gate dielectric layer 114 may comprise a high K (dielectric constant) material, examples of which include, but are not limited to, metal oxides such as $Ta_2O_5$, $BaTiO_3$, $HfO_2$, $ZrO_2$, $Al_2O_3$, metal silicates such as $HfSi_xO_y$ or $HfSi_xO_yN_z$ and combinations of layers thereof. A high K dielectric material has a relative permittivity above about 10. In one example, the gate dielectric layer 114 may have a thickness ranging from approximately 0.5 nm to approximately 5 nm thick, preferably from approximately 1 nm to approximately 3 nm. The sidewall spacers 118 may be fabricated by deposition of a blanket conformal layer followed by a reactive ion etch (RIE) to remove the conformal layer from horizontal surfaces while the conformal layer on vertical surfaces is not removed or partially removed.

One or more of the gate stacks 110 may be part of a transistor (not shown) that is electrically connected to an active wordline (WL) (not shown) and formed in an active WL region 120. In addition, one or more of the gate stacks may be located under a passing wordline (not shown) and formed in a passing WL region 122.

The DT capacitors 112 and of the STI regions 134 may be formed in the SOI substrate 102 below the gate stacks 110 in the passing WL region 122 before the gate stacks 110 are formed. The DT capacitors 112 may extend from the SOI layer 108, through the isolation layer 106 and into the semiconductor layer 104. The DT capacitors 112 may formed by etching a deep trench into the SOI layer 108, the isolation layer 106, and the semiconductor layer 104, and then filling the deep trench with a conductive material. It is understood that each of the DT capacitor 112 may have different horizontal cross-sectional area due to the resulting etch profile caused by the variations in the grain orientation of the SOI layer 108, the isolation layer 106, and the semiconductor layer 104.

The DT capacitors 112 may include an upper region 124 and a lower region 126. The upper region 124 may be present in the SOI layer 108 and the isolation layer 106. The upper region 124 may be composed of at least one fill material, preferably a conductive material such as a metallic material or a doped semiconductor material. The at least one fill material can be deposited, for example, by low pressure chemical vapor deposition (LPCVD) or atomic layer deposition (ALD). The metallic material can include at least one of Ta, Ti, W, CoWP, TaN, TiN, and WN. The doped semiconductor material can include doped polysilicon, germanium, a silicon germanium alloy, and/or any doped compound semiconductor material.

The lower region 126 may extend from an upper surface 130 of the semiconductor layer 104 into an interior portion of the semiconductor layer 104. The lower region 126 may be composed of the same or a similar conductive material as the upper region 124 and may be formed using substantially similar methods. The lower region 126 may have a node dielectric layer 132 (hereinafter "node dielectric") formed on its sidewalls and bottom surface. The node dielectric 132 may be formed in the deep trench using a conformal deposition process before the conductive material used to form the lower region 126 is deposited. The node dielectric 132 may be formed by thermal oxidation, chemical oxidation, thermal nitridation, ALD, chemical CVD, LPCVD, and/or any other suitable methods.

The node dielectric 132 may be composed of a high-k dielectric material, such as for example, silicon oxide, silicon nitride, silicon oxynitride, or any combination of these materials. In an embodiment, the node dielectric 132 may be composed of a dielectric metal oxide having a dielectric constant greater than 8.0. Example of dielectric metal oxides that may be used include, for example, hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate, and any combination of these materials.

The DT capacitors 112 may be electrically connected to a transistor (not shown). The transistor may incorporate the gate stacks 110 in the active WL region 120. The DT capacitors 112 may store electrical charges that flow from a bit line (not shown) through a channel (not shown) under one of the gate stacks 110 in the active WL region 120 when the active WL turns on the transistor. The DT capacitors 112 may have a minimum capacitance required to provide sufficient retention time and addressability, ranging from approximately 5 fF to approximately 40 fF, preferably from approximately 8 fF to approximately 15 fF. The capacitance of the DT capacitors 112 may be proportional to the surface area of the node dielectric 132.

The STI region 134 may be in contact with the gate stacks 110 in the passing WL region 122. The STI region 134 may electrically isolate the gate stacks 110 in the passing WL region 122 from the DT capacitors 112, the gate stacks 110 in the active WL region 120, as well as other devices (not shown) in the passing WL region 122. The STI region 134 may be formed by etching a trench (not shown) into the SOI layer 108, the isolation layer 106, and a portion of the upper region 124, and filling the trench with a low-k dielectric material, such as, for example, silicon oxide. The dielectric material may then be planarized so that an upper surface 136 of the STI region 134 is substantially flush with an upper surface 138 of the SOI layer 108.

Figure 2:
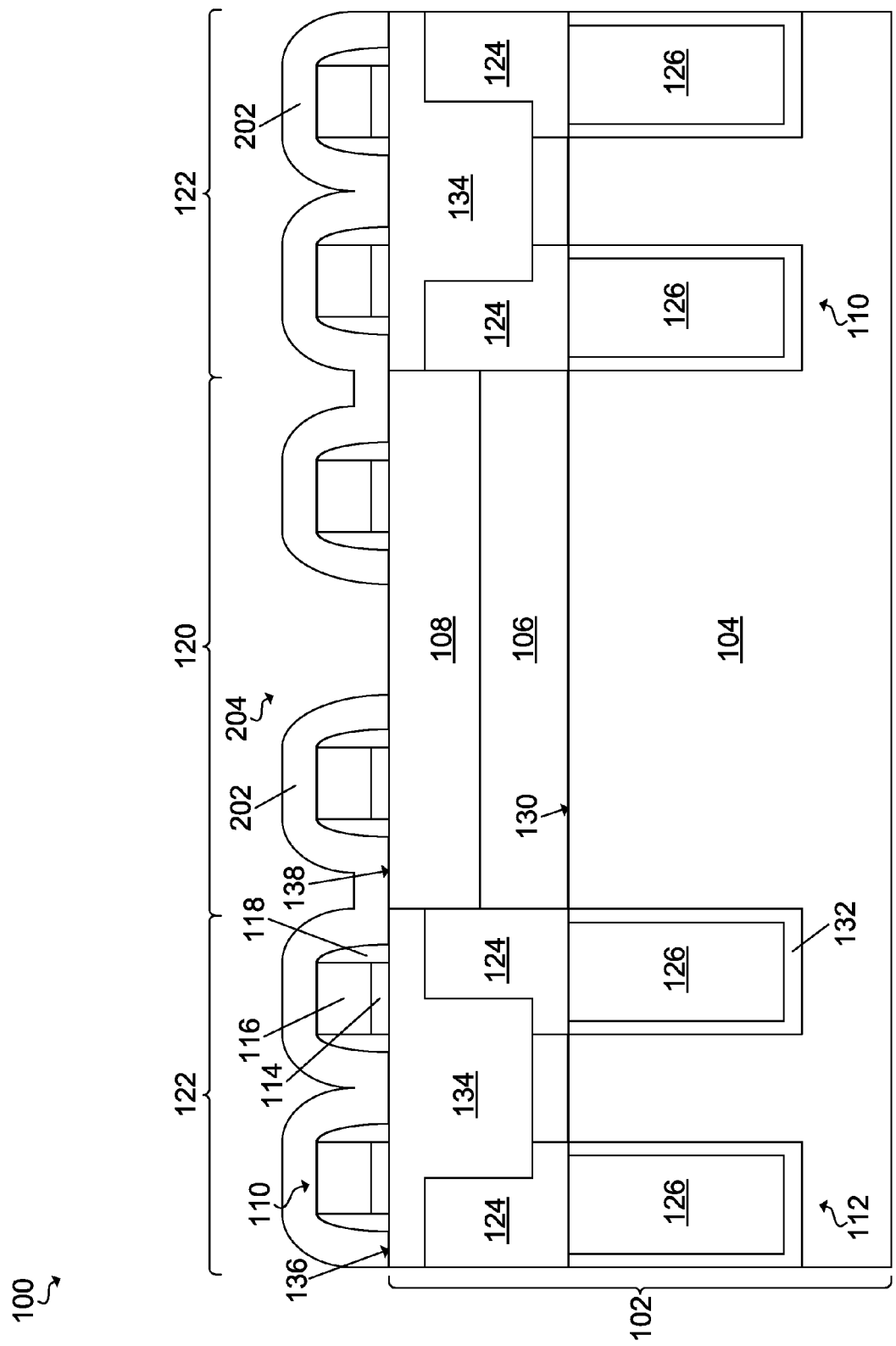
FIG. 2 is a cross section view illustrating forming a protective layer on the structure, according an embodiment of the present invention.

Referring now to FIG. 2 a cross section view illustrating forming a protective layer 202 on the structure 100 is shown. In an embodiment, the protective layer 202 may be composed of a nitride, such as for example, silicon nitride. The protective layer 202 may be deposited as a conformal layer over the SOI layer 108, the STI region 134, and the gate stacks 110 using any conventional deposition technique known in the art, such as, for example, ALD, CVD, physical vapor deposition (PVD), molecular beam deposition (MBD), pulsed laser deposition (PLD), or liquid source misted chemical deposition (LSMCD). A portion of the protective layer 202 may be removed using conventional lithography and etching techniques to from a contact region 204. In an embodiment, a patterning layer (not shown) may be blanket deposited over the protective layer 202 using a conventional deposition technique, such as those listed above, and then using conventional photolithography techniques and reactive ion etching (RIE) to remove the portion of the protective layer 202. In an embodiment, the patterning layer may be removed after the portion of the protective layer 202 is removed. In another embodiment, the patterning later may remain during further fabrication steps as described in detail below. A portion of the SOI layer 108 may be exposed in the contact region 204 between two gate stacks 110 in the active WL region 120.

Figure 3:
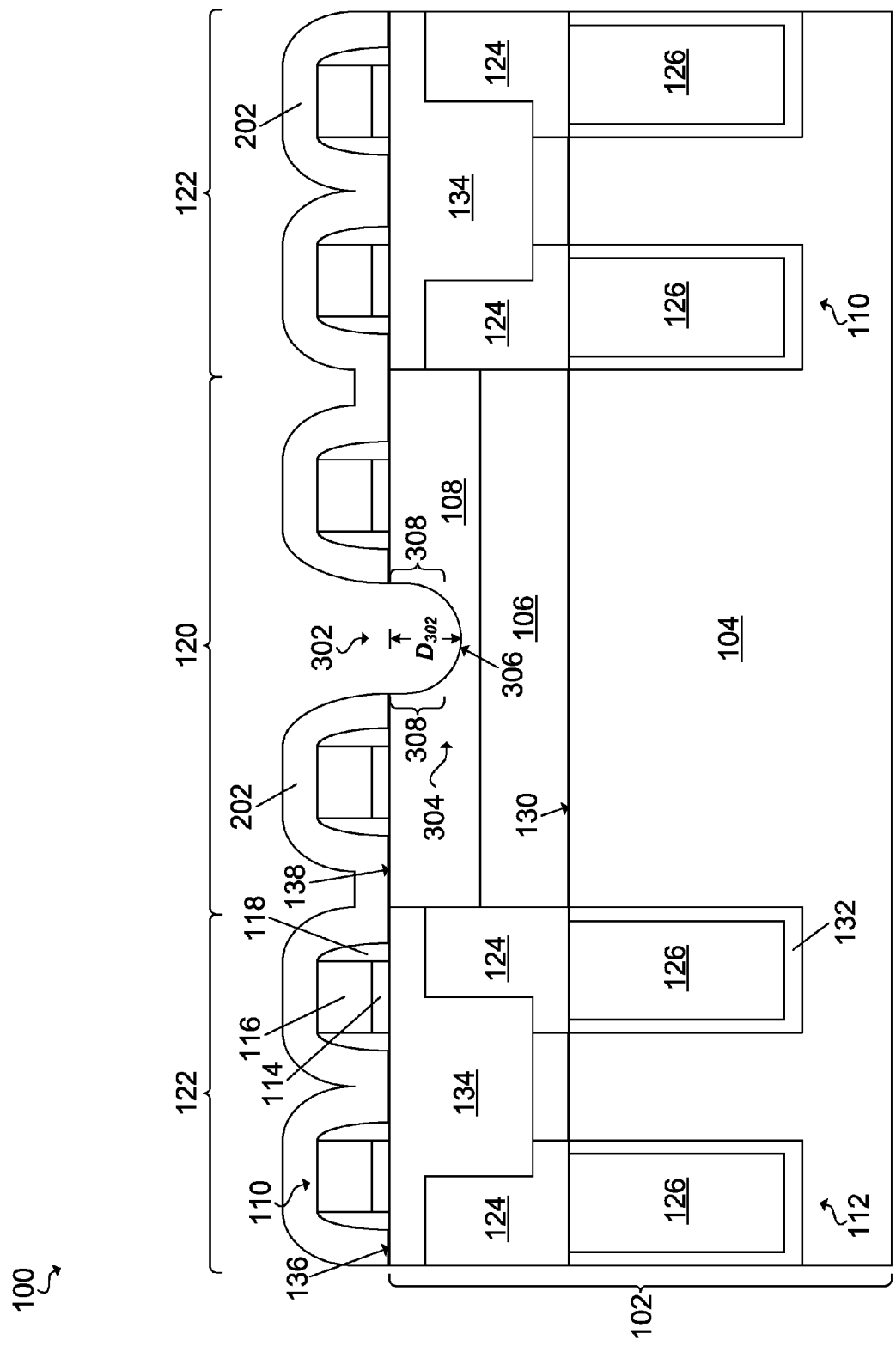
FIG. 3 is a cross section view illustrating forming a trench in a SOI layer of the structure, according an embodiment of the present invention.

Referring now to FIG. 3, a cross section view illustrating forming a trench 302 in the SOI layer 108 is shown. The trench 302 may be formed by removing the portion of the SOI layer 108 exposed in the contact area 204 (FIG. 2) using an etching process selective to the protective layer 202, such as, for example etchants containing fluorine (i.e., $CF_4$, $NF_3$, $CHF_3$ and $SF_6$). The trench 302 may extend only partially through the entire thickness T108 of the SOI layer 108, exposing an interior region 304 of the SOI layer 108. The trench 302 may have a bottom 306 and a pair of sidewalls 308. In an embodiment, the bottom 306 may have a substantially rounded shape. In an embodiment, the trench 302 may have a depth D302 ranging from approximately 40 nm to 80 nm.

Figure 4:
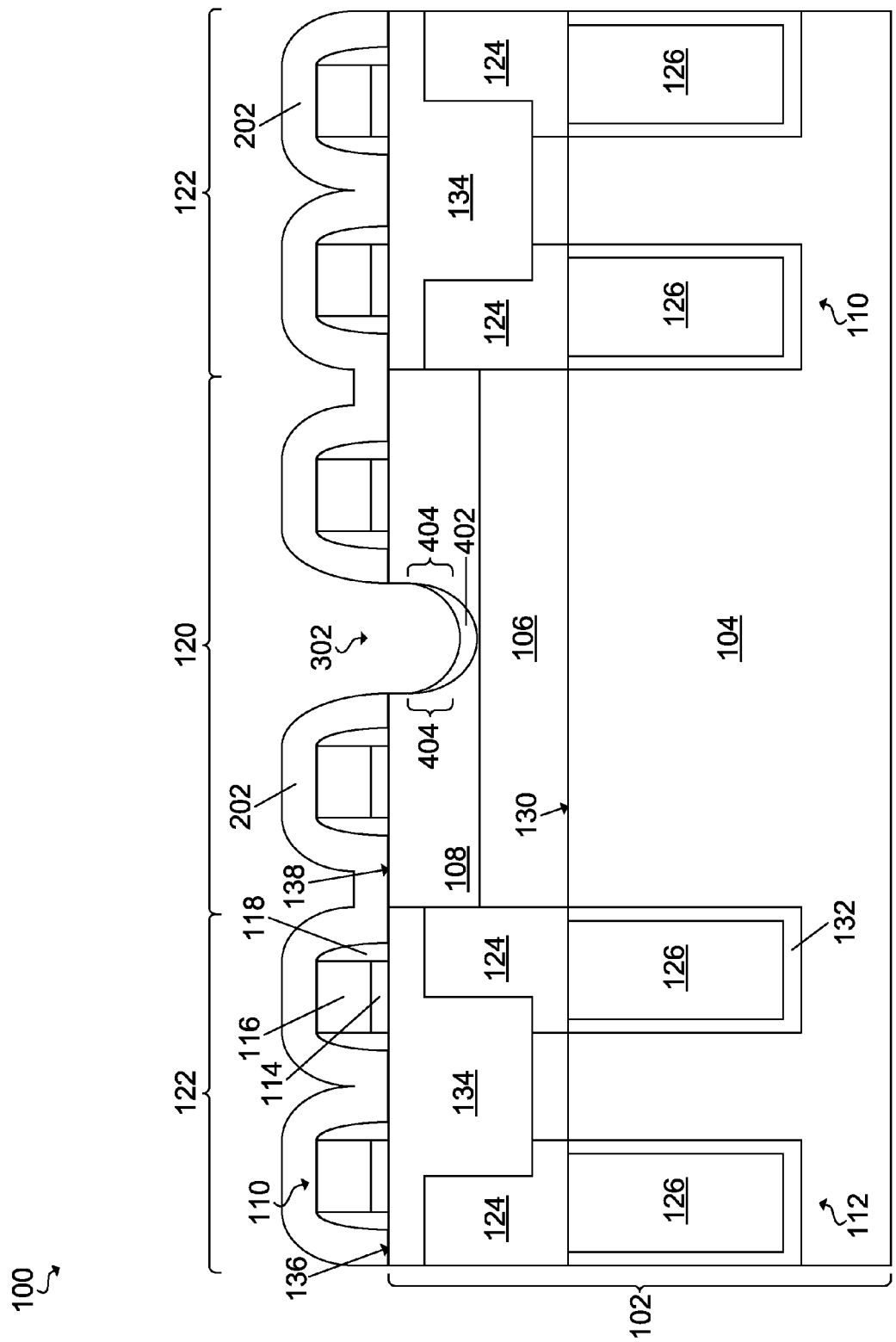
FIG. 4 is a cross section view illustrating forming a junction butting region at the bottom of the trench, according an embodiment of the present invention.

Referring now to FIG. 4, a cross section view illustrating forming a low energy junction butting region 402 (hereinafter "junction butting region") at the bottom of the trench 302 is shown. The junction butting region 402 may be formed by implanting dopants, such as, for example, arsenic or phosphorus for an NFET, or boron or born fluoride for a PFET. The dopants may be implanted into the SOI layer 108 directly below the trench 302 using a low energy ion implantation technique, for example approximately 2 keV to approximately 10 keV, and preferably approximately 3 keV to approximately 6 keV. In an embodiment, the junction butting region 402 may have an upper portion 404 adjacent to the pair of sidewalls 308 of the trench 302. The upper portion 404 may have a lower concentration of dopant atoms than the rest of the junction butting region 402 located below the bottom 306.

In an embodiment, the junction butting region 402 may be in contact with the isolation layer 106, thereby forming a solid butting. The solid butting may substantially reduce pathways for current to flow between adjacent gate stacks 110, thereby reducing body to body leakage. The low energy ion implantation technique may require less energy to form the junction butting region 402, and may result in less damaging ion scattering, than conventional techniques. Because the trench 302 may expose the interior region 304 of the SOI layer 108, less energy is required to implant the dopant ions in this region than may be required in conventional techniques such as deep source-drain implantation. In addition, the protective layer 202 may prevent neighboring devices and other portions of the SOI layer 108 from being doped or damaged by the low energy ion implantation technique used to form the junction butting region 402. Both of these features may reduce the amount of ion scattering in the structure 100, thereby improving performance and reliability.

Figure 5:
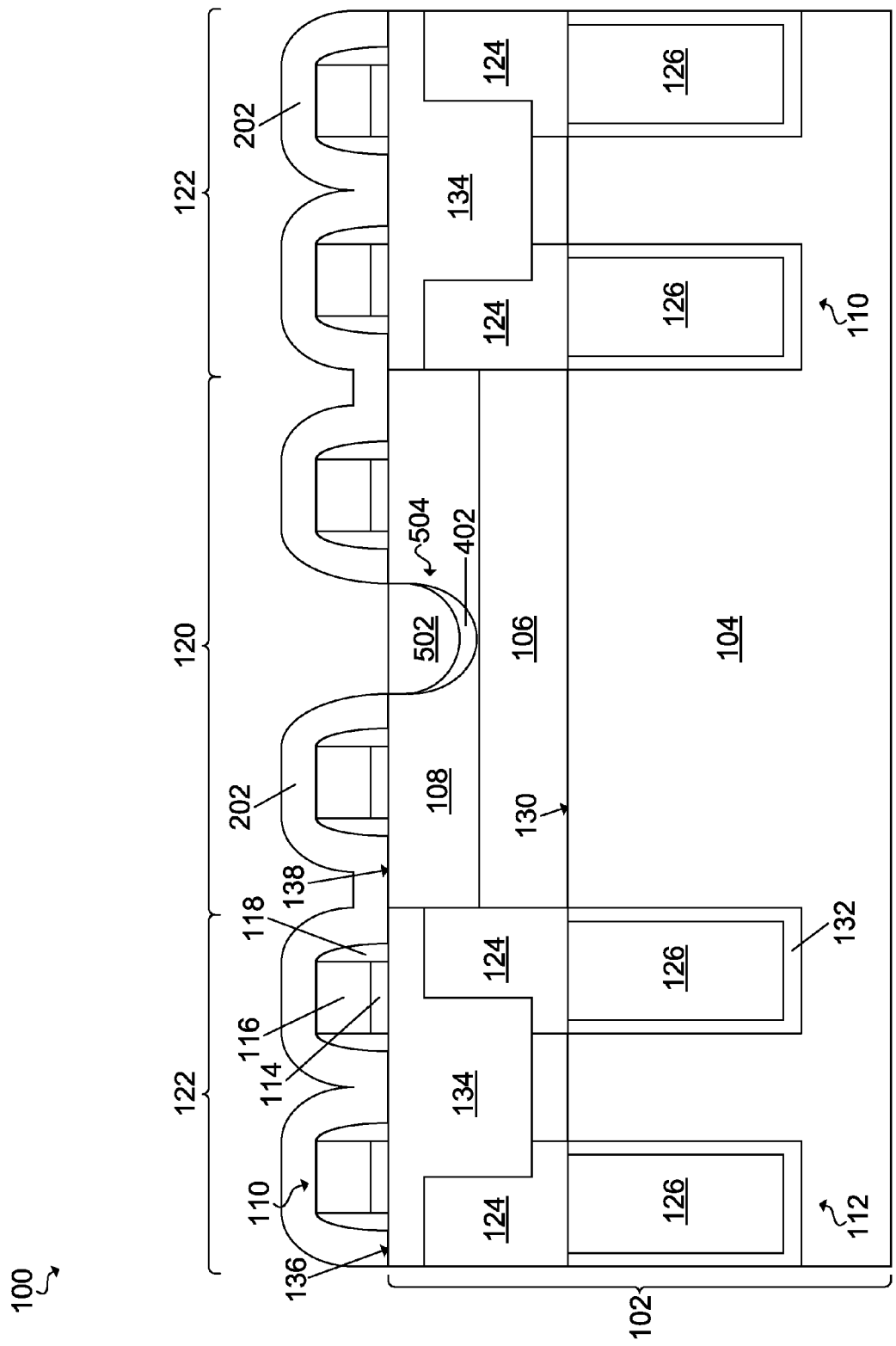
FIG. 5 is a cross section view illustrating filling the trench with a doped epitaxial material to form a source-drain (S-D) region, according an embodiment of the present invention.

Referring now to FIG. 5, a cross section view illustrating filling the trench 302 (FIG. 4) with a doped epitaxial material 502 to form a source-drain region 504 (hereinafter "S-D region"). In an embodiment, the doped epitaxial material 502 may include layers of epitaxial material with adjacent layers having different dopant concentrations so that the doped epitaxial material 502 achieves a graded doping profile. The doped epitaxial material 502 may be, for example, silicon carbide (SiC) with phosphorus or arsenic doping for an NFET. In another exemplary embodiment, the epitaxial material 502 could be silicon germanium (SiGe) doped with boron or boron difluoride for a PFET. In an embodiment, the epitaxial material 502 may be formed using in-situ doping. The doped epitaxial material 502 may be graded such that side portions of the S-D region 504 are lightly doped while the center of the S-D region 504 is more highly doped. This concentration gradient may provide a well-graded junction profile after activation, may reduce junction leakage and may improve performance and yield.

After the epitaxial material 502 is deposited, the semiconductor structure 100 may be annealed to activate the dopant atoms in the epitaxial material 502 and form the final S-D region 504. In an embodiment, the annealing process may include subjecting the structure 100 to an elevated temperature, ranging from approximately 800° C. to approximately 1000° C., for approximately 1 millisecond. In an embodiment, the annealing process may be a rapid thermal anneal (RTA). During annealing, the individual layers of the doped epitaxial material 502 may become comingled as one layer with a graded dopant concentration (i.e., dose activation) as discussed above.

Figure 6:
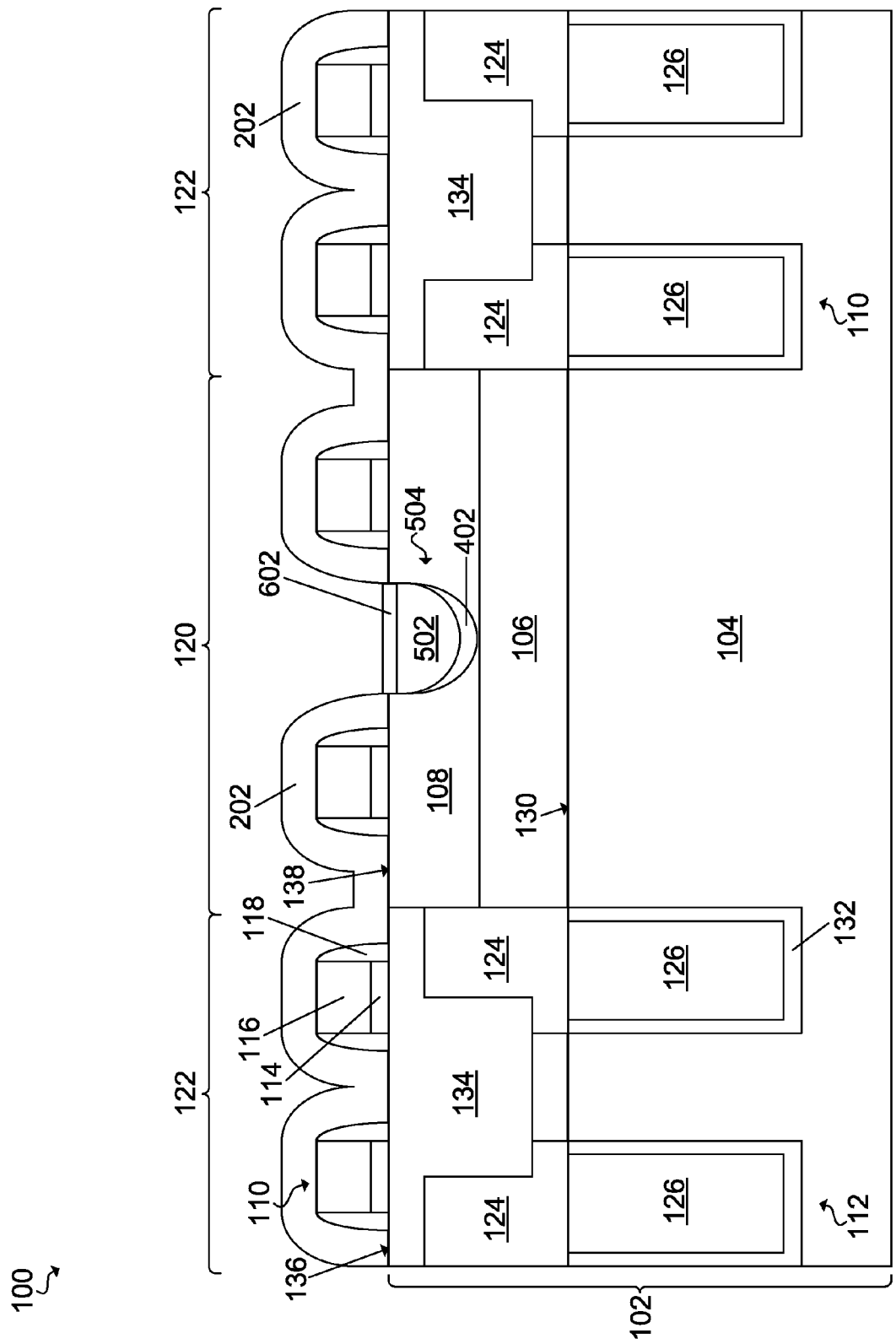
FIG. 6 is a cross section view illustrating forming a silicide on the S-D region, according an embodiment of the present invention.

Referring now to FIG. 6, a cross section view illustrating forming a silicide 602 on the S-D region 504 is shown. The silicide 602 may be formed by any known technique for forming silicides known in the art. In an embodiment, the silicide 602 may be formed by depositing a conductive metal layer (not shown) over the protective layer 202 and the silicon-containing S-D region 504 using any conventional deposition technique known in the art, such as, for example, ALD, CVD, PVD, MBD, PLD, LSMCD, or sputtering. Examples of conductive metals that may be used include, but are not limited to, platinum, titanium, cobalt, nickel, and alloys thereof. The conductive metal layer may have a thickness ranging from approximately 5 nm to approximately 15 nm.

After the conductive metal layer is deposited, the structure 100 may be annealed, using any conventional annealing technique known in the art, to cause the conductive metal to react with the silicon in the S-D region 504 and form a silicide. In an embodiment, a rapid thermal annealing technique may be used wherein the structure 100 is heated to a temperature ranging from approximately 400° C. to approximately 700° C. for a time ranging from approximately 1 s to approximately 60 s. The conductive metal layer may not react with the protective layer 202 and may be removed after the annealing using conventional techniques, such as a solvent wash, so that only the silicide 602 remains.

Figure 7:
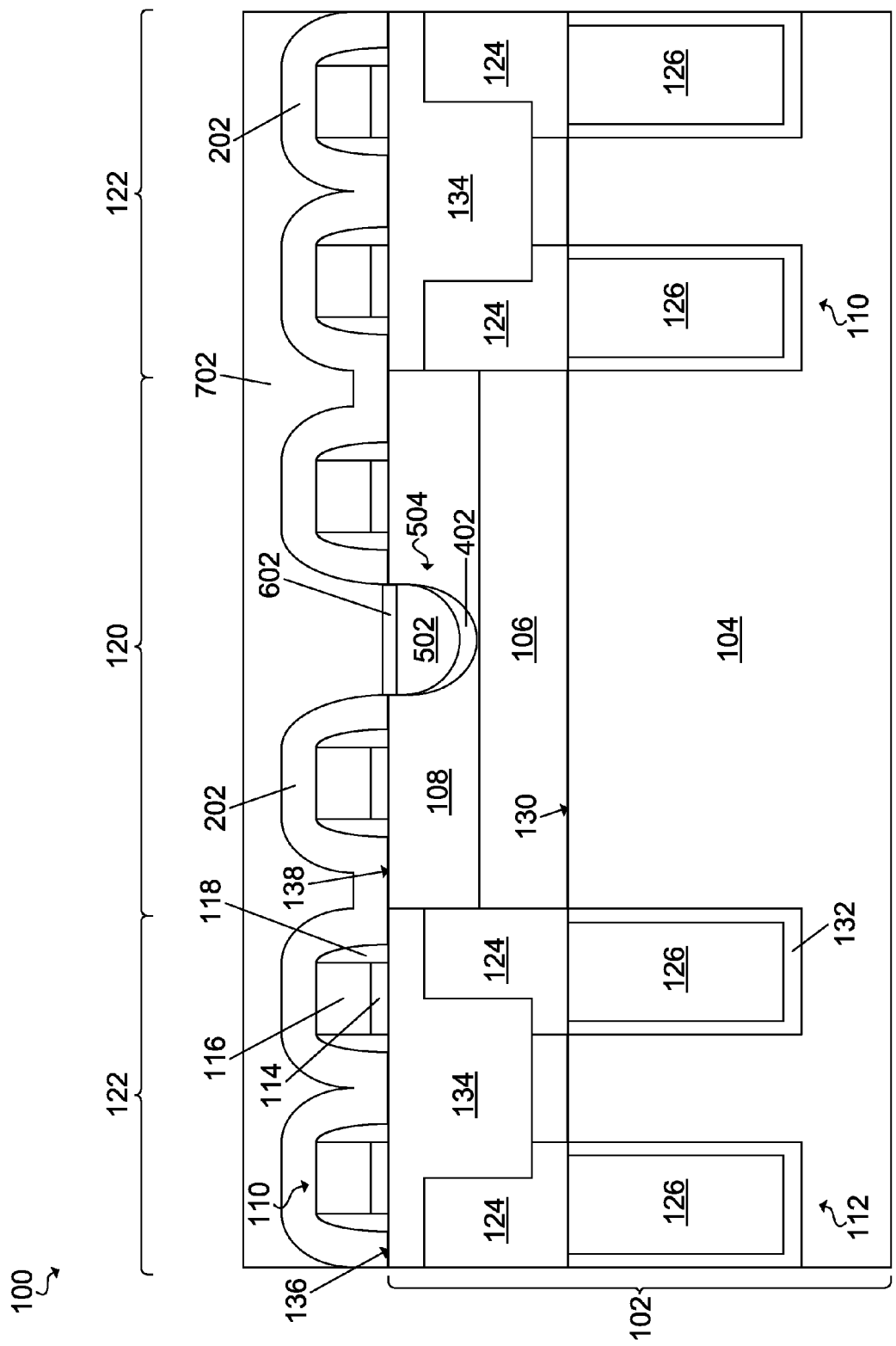
FIG. 7 is a cross section view illustrating forming a dielectric layer over the protective layer and the silicide, according an embodiment of the present invention.

Referring now to FIG. 7, a cross section view illustrating forming a dielectric layer 702 over the protective layer 202 and the silicide 602 is shown. The dielectric layer 702 may be formed by depositing a blanket layer of dielectric material using any conventional deposition technique known in the art, such as, for example, ALD, CVD, PVD, MBD, PLD, LSMCD, or spin-on deposition. The dielectric layer 702 may be composed of a low-k dielectric material, such as, for example, an oxide, a polyimide, polynorbornene, benzocyclobutene, polytetrafluoroethylene (PTFE), hydrogen silsesquioxane (HSQ), methylsilsesquioxane (MSQ), or combinations thereof. After the dielectric layer 702 is deposited, it may be planarized using any conventional planarization technique, such as, for example chemical mechanical planarization (CMP).

Figure 8:
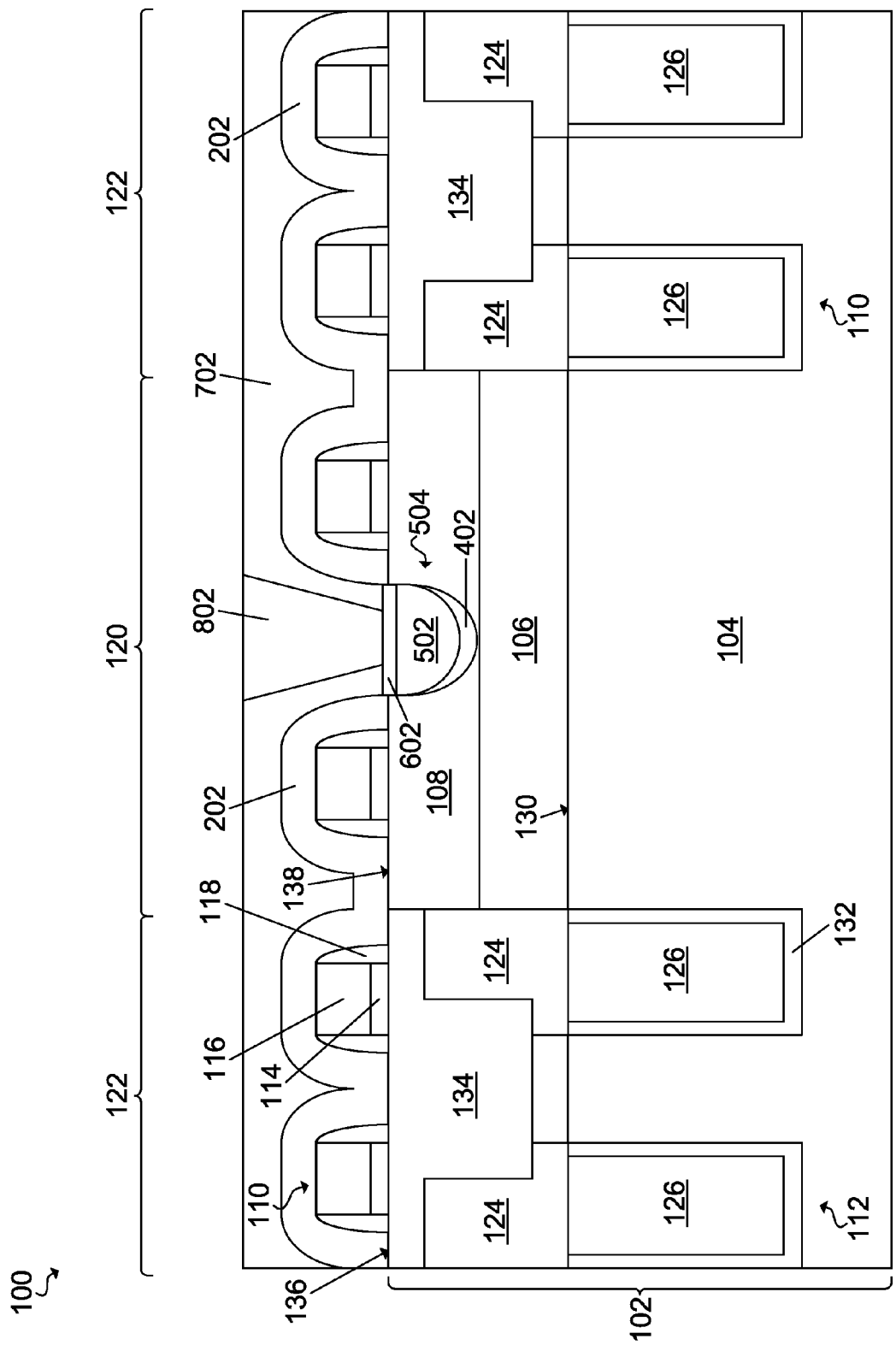
FIG. 8 is a cross section view illustrating forming a contact in the dielectric layer, according an embodiment of the present invention.

Referring now to FIG. 8, a cross section view illustrating forming a contact 802 in the dielectric layer 702 is shown. The contact 802 may extend from an upper surface of the dielectric layer 702 to an upper surface of the silicide 602. The contact 802 may be formed by patterning and etching the dielectric layer 702, selective to the silicide 602, using conventional techniques such as photolithography and RIE to form a contact trench (not shown). The contact trench may then be filled with a conductive material using any conventional deposition technique known in the art, such as, for example, ALD, CVD, PVD, MBD, PLD, LSMCD, spin-on deposition, sputtering, or electroplating. In an embodiment, the conductive material may be a metal, such as aluminum or copper.

After the contract trench is filled with the conductive material, the conductive material and the dielectric layer 702 may be planarized using any conventional planarization technique, such as, for example CMP, so that an upper surface of the contact 802 is substantially flush with an upper surface of the dielectric layer 702. In an embodiment, the contact 802 may also include a contact liner (not shown) formed between its sidewalls and the dielectric layer 702. The contact liner may be composed of a nitride, such as for example, titanium nitride and may act as a barrier to prevent the conductive material of the contact 802 from diffusing into the dielectric layer 702.

Embodiments of the present invention may allow for the fabrication of a junction butting region 402 in the SOI layer 108 below the trench 302 that is strongly butted to the isolation layer 106. The junction butting region 402 may be formed using a low energy ion implantation technique that may require less energy and may result in less ion scattering as compared to conventional techniques of forming junction butting regions. The use of low energy ion implantation in the trench 302 may provide a more graded dopant profile in the junction butting region 402, which in combination with a solidly butted junction region 402 in contact with the isolation layer 106, may reduce under junction leakage and cross talk between adjacent devices sharing the same contact 802. In addition, the protective layer 202 used to form the trench 302 may provide further protection the SOI layer 108 and devices (including the gate stacks 110) adjacent to the trench 302 damage caused by any ion scattering (which may already be reduced by the use of low energy ion implantation. The reduction in ion scattering may increase reliability and performance in devices by reducing damage to the channel regions of the SOI layer 108 below the gate stacks 110 (i.e., short channel defects) in transistors found in eDRAM devices.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming a protective layer over a first gate stack and a second gate stack;
   removing a portion of the protective layer between a first gate stack and a second gate stack to expose a semiconductor on insulator (SOI) layer;
   forming a trench in the SOI layer; and
   forming a junction butting region in an active wordline region directly below the trench by doping the SOI layer using a low energy ion implantation technique, wherein the first gate stack and the second gate stack are protected from ion scattering during the low energy ion implantation technique by the protective layer, and wherein a final width of the junction butting region does not exceed a horizontal distance between the first gate stack and the second gate stack.

2. The method of claim 1, further comprising:
   forming a source-drain (S-D) region in the trench using epitaxial growth;
   forming a silicide on the S-D region;
   forming a dielectric layer over the silicide and the protective layer; and
   forming a contact in the dielectric layer, the contact extending from an upper surface of the dielectric layer to an upper surface of the silicide.

3. The method of claim 1, wherein the low energy ion implantation technique comprises an ion energy ranging from 2 keV to 10 keV.

4. The method of claim 1, wherein the junction butting region has a bottom surface that is in contact with an upper surface of an isolation layer located below the SOI layer.

5. The method of claim 1, wherein the protective layer comprises a nitride.

6. A method comprising:
   forming a protective layer over a first gate stack, over a second gate stack, and over a portion of a semiconductor on insulator (SOI) layer, wherein the portion of the SOI layer is between the first gate stack and the second gate stack;
   removing a portion of the protective layer over the portion of the SOI layer, causing the portion of the SOI layer to be exposed and the first gate stack and the second gate stack remain covered by the protective layer;
   forming a trench in the portion of the SOI layer, wherein the trench has a bottom and a pair of sidewalls, and wherein a depth of the trench is less than a thickness of the SOI layer; and
   doping the SOI layer at the bottom of the trench using a low energy ion implantation technique to form a junction butting region in an active wordline region, such that the junction butting region extends from the bottom of the trench to an isolation layer immediately below the SOI layer, and wherein a final width of the junction butting region does not exceed a horizontal distance between the first gate stack and the second gate stack.

7. The method of claim 6, further comprising:
   forming a source-drain (S-D) region in the trench by substantially filling the trench with a semiconducting material;
   forming a silicide on the S-D region;
   forming a dielectric layer over the silicide and the protective layer; and
   forming a contact in the dielectric layer, the contact extending from an upper surface of the dielectric layer to an upper surface of the silicide.

8. The method of claim 6, wherein the low energy ion implantation technique comprises an ion energy ranging from 2 keV to 10 keV.

9. The method of claim 6, wherein the protective layer comprises a nitride.

10. The method of claim 6, further comprising:
    doping the SOI layer adjacent to the pair of sidewalls using the low energy ion implantation technique to form an upper portion of the junction butting region.

11. The method of claim 6, wherein the junction butting region and the S-D region are comprised of a N-type dopant and the SOI layer is comprised of a P-type dopant.

12. The method of claim 6, wherein the junction butting region and the S-D region are comprised of a P-type dopant and the SOI layer is comprised of a N-type dopant.

* * * * *